United States Patent
Huang et al.

(10) Patent No.: US 11,611,288 B2
(45) Date of Patent: Mar. 21, 2023

(54) COMPOSITE SWITCHING DEVICE WITH SWITCHING DEVICE AND DIODE IN PARALLEL

(71) Applicant: Delta Electronics (Shanghai) Co., Ltd., Shanghai (CN)

(72) Inventors: Junlai Huang, Shanghai (CN); Youzhun Cai, Shanghai (CN); Lingfeng Jiang, Shanghai (CN); Junhao Ji, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 107 days.

(21) Appl. No.: 17/189,278

(22) Filed: Mar. 2, 2021

(65) Prior Publication Data
US 2021/0313901 A1    Oct. 7, 2021

(30) Foreign Application Priority Data
Apr. 3, 2020    (CN) .......................... 202010257842.0

(51) Int. Cl.
| | |
|---|---|
| H02M 1/10 | (2006.01) |
| H02M 7/219 | (2006.01) |
| H02M 1/08 | (2006.01) |
| H03K 17/687 | (2006.01) |
| H03K 17/081 | (2006.01) |
| H03K 17/08 | (2006.01) |
| H02M 1/00 | (2006.01) |

(52) U.S. Cl.
CPC ............. *H02M 7/219* (2013.01); *H02M 1/08* (2013.01); *H02M 1/10* (2013.01); *H03K 17/08116* (2013.01); *H03K 17/687* (2013.01); *H02M 1/0054* (2021.05); *H03K 2017/0806* (2013.01)

(58) Field of Classification Search
CPC ...... H02M 1/10; H02M 7/219; H02M 7/2195; H02M 1/0054; H02M 1/08; H03K 17/08116; H03K 17/687; H03K 2017/0806
See application file for complete search history.

(56) References Cited

U.S. PATENT DOCUMENTS

| | | | | |
|---|---|---|---|---|
| 2013/0257390 A1* | 10/2013 | Jin | ....................... | H02M 1/4233 |
| | | | | 323/205 |
| 2017/0302169 A1* | 10/2017 | Yamada | .................. | H02M 7/12 |
| 2017/0338815 A1* | 11/2017 | Laven | ..................... | H01L 29/47 |

(Continued)

FOREIGN PATENT DOCUMENTS

| CN | 101588140 B | 8/2012 |
|---|---|---|
| CN | 104380126 A | 2/2015 |

(Continued)

*Primary Examiner* — Harry R Behm
(74) *Attorney, Agent, or Firm* — CKC & Partners Co., LLC

(57) ABSTRACT

The present disclosure discloses a composite switching circuit, including a plurality of first semiconductor devices connected in series; and at least one second semiconductor device each connected in parallel to one of the plurality of first semiconductor devices. The composite switching circuit is connected to an input source. The second semiconductor device is turned off during a preset period to transfer a current flowing through the second semiconductor device to the first semiconductor devices connected in parallel to the second semiconductor device.

12 Claims, 4 Drawing Sheets

(56) References Cited

U.S. PATENT DOCUMENTS

2019/0068077 A1\* 2/2019 Ueta .................. H02M 1/08
2019/0131864 A1\* 5/2019 Ikarashi ............. H02M 1/12

FOREIGN PATENT DOCUMENTS

| | | | | |
|---|---|---|---|---|
| CN | 102918769 | B | 2/2016 | |
| CN | 108432119 | A | 8/2018 | |
| DE | 102010063041 | A1 \* | 6/2012 | ............ H02J 7/1461 |
| FR | 3103317 | A1 \* | 5/2021 | ........... H01L 23/473 |
| JP | 2018148125 | A \* | 9/2018 | |

\* cited by examiner

COMPOSITE SWITCHING DEVICE WITH SWITCHING DEVICE AND DIODE IN PARALLEL

CROSS-REFERENCE TO RELATED APPLICATIONS

This non-provisional application claims priority under 35 U.S.C. § 119(a) on Patent Application No. 202010257842.0 filed in P.R. China on Apr. 3, 2020, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited and/or discussed in this specification are incorporated herein by reference in their entireties and to the same extent as if each reference was individually incorporated by reference.

BACKGROUND OF THE INVENTION

1. Field of the Invention

The present disclosure relates to a circuit, and particularly, to a composite switching circuit.

2. Related Art

Under the background of advocating energy saving and environment protection all over the world, the requirement for efficiency of the power supply is increasing. FIG. 1 is a conventional bridge rectifier circuit applied to an AC/DC input source, including four switches S1, S2, S3 and S4. The loss of the switches can be reduced by using a low turn-on resistance MOSFET, thereby improving the efficiency.

As shown in FIG. 1, if the input is a standard sinusoidal alternating current (AC) input, the switches S2 and S3 are turned on in a positive half cycle, and the switches S1 and S4 are turned on in a negative half cycle, so the loss is evenly distributed on the four switches S1 to S4. If the input is a non-standard AC input, the switches S2 and S3 are turned on when an input voltage is positive, and the switches S1 and S4 are turned on when the input voltage is negative. However, the turn-on time of the switches S1, S2, S3 and S4 are not identical, so heat of the switches is not evenly distributed. Moreover, if the input is a direct current (DC) input, since the input voltage is unidirectional, only two of the four switches S1 to S4 are turned on, the loss of the turn-on switches is large, and the turn-on switches may be overheated to cause temperature of relevant switches over specification.

Therefore, how to effectively avoid concentration of the heat generated by the imbalance of the turn-on time of respective switch of a bridge circuit, and avoid the temperature of the switches over specification, becomes one of the problems to be solved in the related art.

SUMMARY OF THE INVENTION

An object of the present disclosure is to provide a composite switching circuit, which can effectively solve the deficiencies of the prior art.

To achieve the above object, the present disclosure provides a composite switching circuit, including: a plurality of first semiconductor devices connected in series; and at least one second semiconductor device each connected in parallel to one of the plurality of first semiconductor devices; wherein the composite switching circuit is electrically coupled to an input source; and wherein the second semiconductor device is turned off during a preset period to transfer a current flowing through the second semiconductor device to the first semiconductor device connected in parallel to the second semiconductor device.

In one embodiment of the present disclosure, the second semiconductor device is a power semiconductor switching device having a body diode, and a turn-on voltage drop of the body diode is larger than that of the first semiconductor devices connected in parallel to the second semiconductor device.

In one embodiment of the present disclosure, the composite switching circuit is applied to a bridge rectifier circuit.

In one embodiment of the present disclosure, the second semiconductor device is selected from a MOSFET, a GaN FET and a SiC MOSFET.

In one embodiment of the present disclosure, at least one of the first semiconductor devices and the at least one second semiconductor device are thermally coupled to different heat dissipation substrates, or thermally coupled to different positions of a same heat dissipation substrate.

In one embodiment of the present disclosure, the heat dissipation substrate is a radiator.

In one embodiment of the present disclosure, the heat dissipation substrate is a thermally conductive pad.

In one embodiment of the present disclosure, when the input source is a DC voltage or a DC current, the second semiconductor device is turned off during the preset period to transfer the current flowing through the second semiconductor device to the first semiconductor device connected in parallel to the second semiconductor device.

The present disclosure further provides a composite switching circuit, including: even first semiconductor devices, every two of the first semiconductor devices connected in series to form a bridge arm; and a plurality of second semiconductor devices each connected in parallel to one of the first semiconductor devices; wherein a plurality of bridge arms are connected in parallel and electrically coupled to an input source; wherein at least part of the second semiconductor devices are turned off during a preset period to transfer a current flowing through the second semiconductor devices to the first semiconductor devices connected in parallel to the second semiconductor devices in turned-off state.

In another embodiment of the present disclosure, the second semiconductor devices are power semiconductor switching devices having body diodes, and a turn-on voltage drop of any one of the body diodes is larger than that of the first semiconductor device connected in parallel to a corresponding one of the second semiconductor devices.

In another embodiment of the present disclosure, the composite switching circuit is applied to a bridge rectifier circuit.

In another embodiment of the present disclosure, the second semiconductor devices are selected from a MOSFET, a GaN FET and a SiC MOSFET.

In another embodiment of the present disclosure, at least one of the first semiconductor devices and at least one of the second semiconductor devices are thermally coupled to different heat dissipation substrates, or thermally coupled to different positions of a same heat dissipation substrate.

In another embodiment of the present disclosure, the heat dissipation substrate is a radiator.

In another embodiment of the present disclosure, the heat dissipation substrate is a thermally conductive pad.

In another embodiment of the present disclosure, when the input source is a DC voltage or a DC current, at least part of the second semiconductor devices are turned off during the preset period to transfer the current flowing through the second semiconductor devices to the first semiconductor devices connected in parallel to the second semiconductor devices in turned-off state.

In the present disclosure, a DC current is transferred to the first semiconductor device connected in parallel to the turn-off second semiconductor device by controlling a part of the second semiconductor devices to be turned off, such that a part of the loss on the second semiconductor devices is transferred to the first semiconductor devices (i.e., the heat is dispersed from the second semiconductor devices to the first semiconductor devices), thereby reducing the temperature of the second semiconductor devices.

The additional aspects and advantages of the present disclosure are partially explained in the below description, and partially becoming apparent from the description, or can be obtained through practice of the present disclosure.

BRIEF DESCRIPTION OF THE DRAWINGS

The exemplary embodiments are described in detail with reference to the accompanying drawings, through which the above and other features and advantages of the present disclosure will become more apparent.

DETAILED EMBODIMENTS OF THE DISCLOSURE

Figure 1:
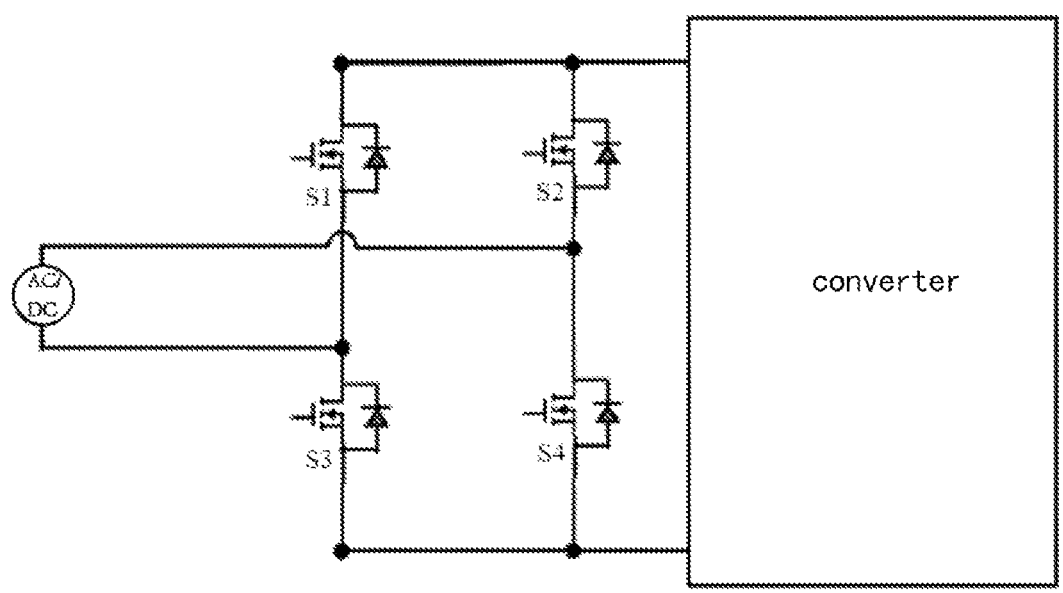
FIG. 1 is a structural diagram of a conventional bridge rectifier circuit applied to an AC/DC input source.

The exemplary embodiments will now be described more fully with reference to the accompanying drawings. However, the exemplary embodiments can be implemented in various forms and should not be understood as being limited to the embodiments set forth herein; on the contrary, these embodiments are provided so that the present disclosure will be thorough and complete, and the conception of the exemplary embodiments will be fully conveyed to those skilled in the art. In the drawings, the same reference numeral denotes the same or similar structure, so their detailed description will be omitted.

When element, component, and the like described and/or illustrated herein are introduced, the phrases "a", "an", "the", "said" and "at least one" refer to one or more elements, components and the like. The terms "include", "comprise" and "have" refer to an open meaning, and additional element, component, and the like may exist, in addition to the listed element, component, and the like. In addition, the terms "first", "second" and the like in the claims are only used as signs, instead of numeral limitation to the object.

Figure 2:
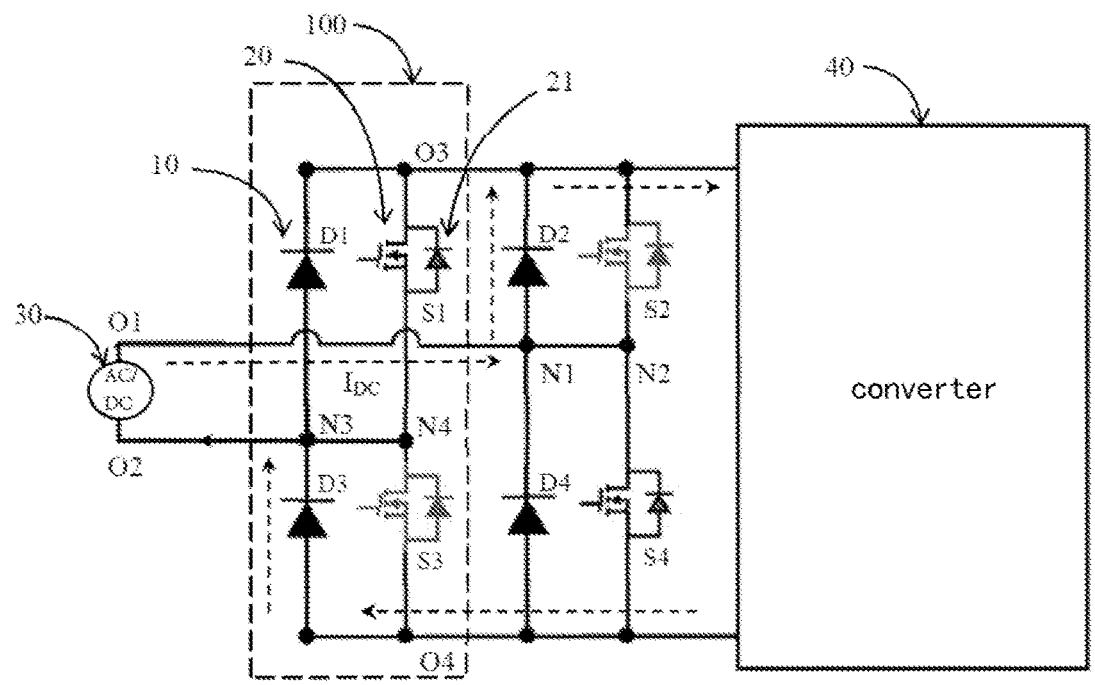
FIG. 2 is a circuit structural diagram of a composite switching circuit applied to a bridge rectifier circuit according to a preferable embodiment of the present disclosure, in which a current is transferred from a second semiconductor device in turned-off state to a first semiconductor device connected in parallel to the second semiconductor device during a preset time period.

As shown in FIG. 2, a composite switching circuit 100 according to a preferable embodiment of the present disclosure includes a plurality of first semiconductor devices 10 connected in series, and a plurality of second semiconductor devices 20. Each of the plurality of second semiconductor devices 20 is connected in parallel to one of the first semiconductor devices 10. Moreover, the composite switching circuit 100 is connected between a first end O1 and a second end O2 of an input source 30. The input source 30 can be an AC source or a DC source. In certain operating conditions, when the input source 30 supplies a DC current $I_{DC}$ to the composite switching circuit 100, a part of the second semiconductor devices 20 may be turned off during a preset period to transfer the DC current $I_{DC}$ to the first semiconductor device 10 connected in parallel to the second semiconductor device 20 in turned-off state. In other operating conditions, when the input source 30 supplies an AC current which is not symmetrical in positive and negative half cycles, a part of the second semiconductor devices 20 may be turned off during a preset period to evenly distribute the heat generated by respective device.

In the embodiment of FIG. 2, the composite switching circuit 100, for example, may include two diodes D1, D3 (i.e., the first semiconductor devices 10) connected in series, and two switches S1, S3 (i.e., the second semiconductor devices 20). The switch S1 is connected in parallel to the diode D1, and the switch S3 is connected in parallel to the diode D3. Preferably, the diodes D1, D3 and the switches S1, S3 may form a bridge arm applied to, for example, a bridge rectifier circuit, but the present disclosure is not limited thereto. The first end O1 of the input source 30 is connected to a node N1 connecting the diodes D2 and D4 and a node N2 connecting the switches S2 and S4, and the second end O2 of the input source 30 is connected to a node N3 connecting the diodes D1 and D3 and a node N4 connecting the switches S1 and S3. Two output ends O3 and O4 of the composite switching circuit 100 may be connected to another circuit (such as, a converter 40) or a load.

In the present disclosure, the second semiconductor devices 20, for example, may be power semiconductor switching devices having body diodes 21, and a turn-on voltage drop of any one of the body diodes 21 is larger than that of the first semiconductor device 10 connected in parallel to a corresponding one of the second semiconductor devices 20. For example, the turn-on voltage drop of the body diode of the switch S2 is greater than that of the diode D2. Preferably, the second semiconductor devices 20 may be selected from a Metal Oxide Semiconductor Field Effect Transistor (MOSFET), a GaN FET and a SiC MOSFET. The type of the second semiconductor devices 20 may be the same. For example, the type of all the second semiconductor devices 20 is MOSFET. The type of the second semiconductor devices 20 may be different. For example, the type of some of the second semiconductor devices 20 is MOSFET, and the type of other second semiconductor devices 20 is GaN FET. However, it should be understood that the present disclosure is not limited thereto.

In another embodiment of the present disclosure, the second semiconductor devices 20 may be formed by connecting a plurality of power semiconductor switching devices in series or in parallel. For example, the second semiconductor devices 20 may be formed by connecting a plurality of power semiconductor switching devices having a low withstand voltage in series, which can reduce the cost while ensuring the second semiconductor devices 20 can withstand a higher voltage. Alternatively, the second semiconductor devices 20 may be formed by connecting a plurality of power semiconductor switching devices having a high on-resistance in parallel, which can reduce the cost while ensuring a larger current can be flowed through the second semiconductor devices 20. However, it should be understood that the present disclosure is not limited thereto.

As shown in FIG. 1, when input source 30 is a DC source (i.e., the composite switching circuit 100 is connected to a DC input), for example, a mid-point voltage of the bridge arm including S2 and S4 is higher than a mid-point voltage of the bridge arm including S1 and S3. At this time, only the switches S2 and S3 are turned on, all currents will flow through the switches S2 and S3, and no current will flow through the switches S1 and S4, so the loss of the switches S2 and S3 is large, and the generated heat is concentrated on the switches S2 and S3, causing the temperature over specification.

In the circuit of the present disclosure shown in FIG. 2, when an input is a DC current or voltage, the switch S2 is selectively turned off since a turn-on voltage drop of the body diode of the switch S2 is larger than that of the diode D2 connected in parallel to the switch S2, and the switch S3 is selectively turned off since a turn-on voltage drop of the body diode of the switch S3 is larger than that of the diode D3 connected in parallel to the switch S3. Therefore, the current is transferred to the diodes D2 and D3. In conclusion, when the input source is a DC source, a part of the loss on the switches S2 and S3 can be transferred to the corresponding diodes D2 and D3 by controlling a driving signal of the switches S2 and S3, thereby decreasing the loss of the switches S2 and S3, and reducing the temperature of the switches S2 and S3. For example, in FIG. 2, the DC current $I_{DC}$ may flow in a direction shown by a dotted arrow, such that the loss of the switches S2 and S3 may be transferred (i.e., transferred to the diodes D2 and D3), thereby avoiding the problem of the temperature over specification caused by the overheating of the switches S2 and S3 because of being turned on for a long time.

Figure 3:
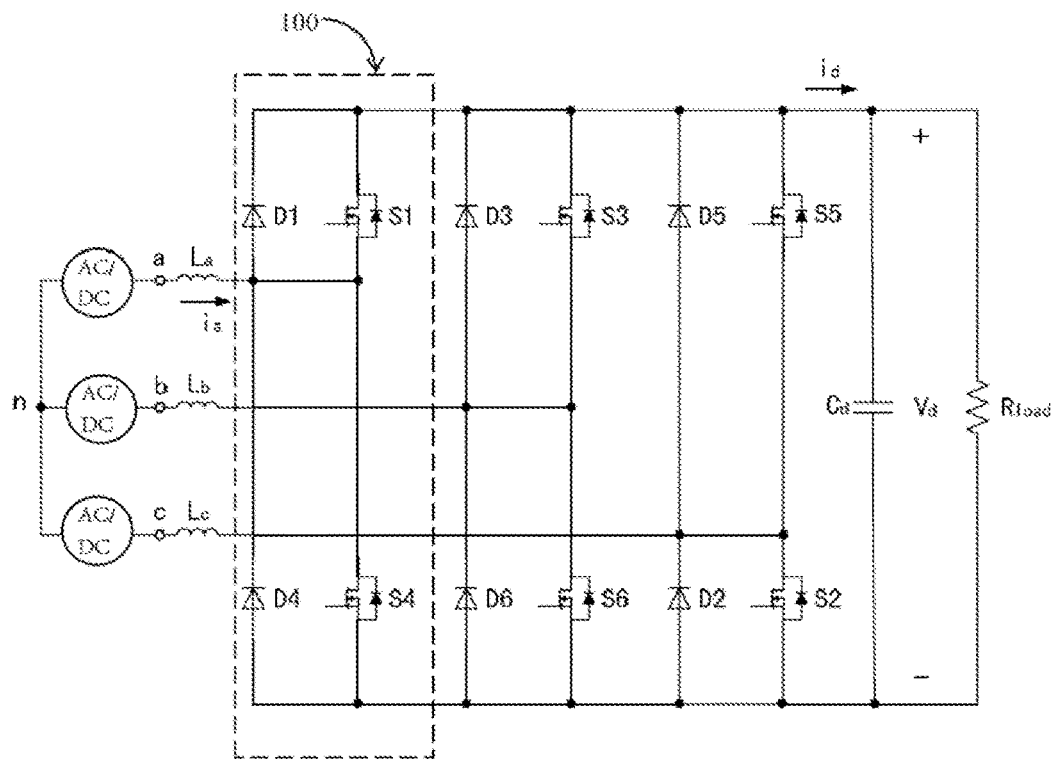
FIG. 3 is a circuit structural diagram of a composite switching circuit applied to a three-phase rectifier circuit according to the present disclosure.

As shown in FIG. 3, the composite switching circuit 100 of the present disclosure can also be applied to a three-phase rectifier circuit. The composite switching circuit 100 includes two diodes D1, D4 (i.e., the first semiconductor devices 10) connected in series, and two switches S1, S4 (i.e., the second semiconductor devices 20). The switch S1 is connected in parallel to the diode D1, and the switch S4 is connected in parallel to the diode D4. Besides the composite switching circuit 100, the three-phase rectifier circuit also includes switches S3, S6, S5 and S2, diodes D3, D6, D5 and D2, inductors $L_a$, $L_b$, and $L_c$, and a capacitor $C_d$. Moreover, one end of phase a of the input source is connected to a node connecting the diodes D1 and D4 and a node connecting the switches S1 and S4 through an inductor $L_a$. One end of a phase b of the input source is connected to a node connecting diodes D3 and D6 connected in series and a node connecting a switch S3 connected in parallel to the diode D3 and a switch S6 connected in parallel to the diode D6 through an inductor $L_b$. One end of phase c of the input source is connected to a node connecting diodes D5 and D2 connected in series and a node connecting a switch S5 connected in parallel to the diode D5 and a switch S2 connected in parallel to the diode D2 through an inductor $L_c$. The other end of the phase a of the input source, the other end of the phase b of the input source, and the other end of the phase c of the input source are connected to a node n. Output of the composite switching circuit 100 is connected to a capacitor $C_d$ and a load $R_{load}$. Diodes D1 and D4 form a first bridge, diodes D3 and D6 form a second bridge, and diodes D5 and D2 form a third bridge. The first bridge, the second bridge and the third bridge are all connected in parallel with the capacitor $C_d$. The voltage across the capacitor $C_d$ is $V_d$.

For example, when input source of phase a is a DC current or voltage, the switches S1 and S2 are turned off during a preset period, such that a DC current $i_a$ may be transferred to the diodes D1 and D2 connected in parallel to the switches S1 and S2, and the loss of the switches S1 and S2 may be transferred (i.e., transferred to the diodes D1 and D2), thereby avoiding the problem of the temperature over specification caused by the overheating of the switches S1 and S2 because of being turned on for a long time.

Figure 4:
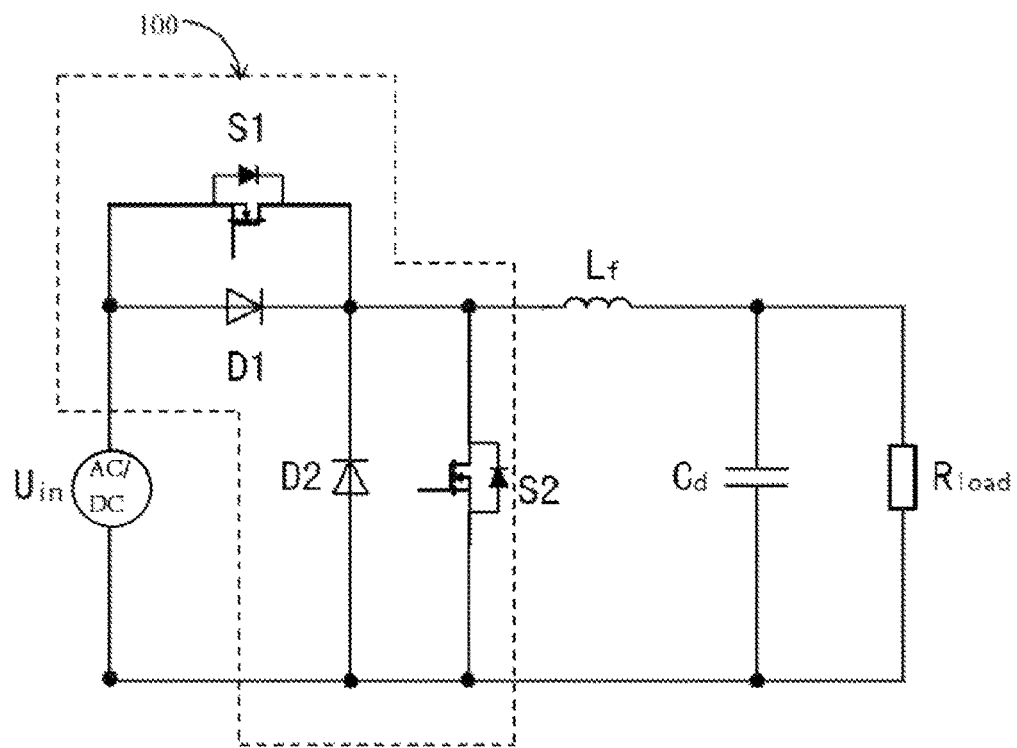
FIG. 4 is a circuit structural diagram of a composite switching circuit applied to a non-bridge rectifier circuit according to the present disclosure.

As shown in FIG. 4, the composite switching circuit 100 of the present disclosure also can be applied to a non-bridge rectifier circuit. The composite switching circuit 100 includes two diodes D1, D2 (i.e., the first semiconductor devices 10) connected in series, and two switches S1, S2 (i.e., the second semiconductor devices 20). The switch S1 is connected in parallel to the diode D1, and the switch S2 is connected in parallel to the diode D2. The input of the composite switching circuit 100 is connected to an input source $U_{in}$, and the output of the composite switching circuit 100 is connected to a circuit including an inductor $L_f$, a capacitor $C_d$ and a load $R_{load}$.

When the input source is a DC current or voltage, the switches S1 and S2 are turned off during a preset period, such that the DC current is transferred to the diodes D1 and D2 connected in parallel to the switches S1 and S2, and the loss of the switches S1 and S2 may be transferred (i.e., transferred to the diodes D1 and D2), thereby avoiding the problem of the temperature over specification caused by the overheating of the switches S1 and S2 because of being turned on for a long time.

Figure 5:
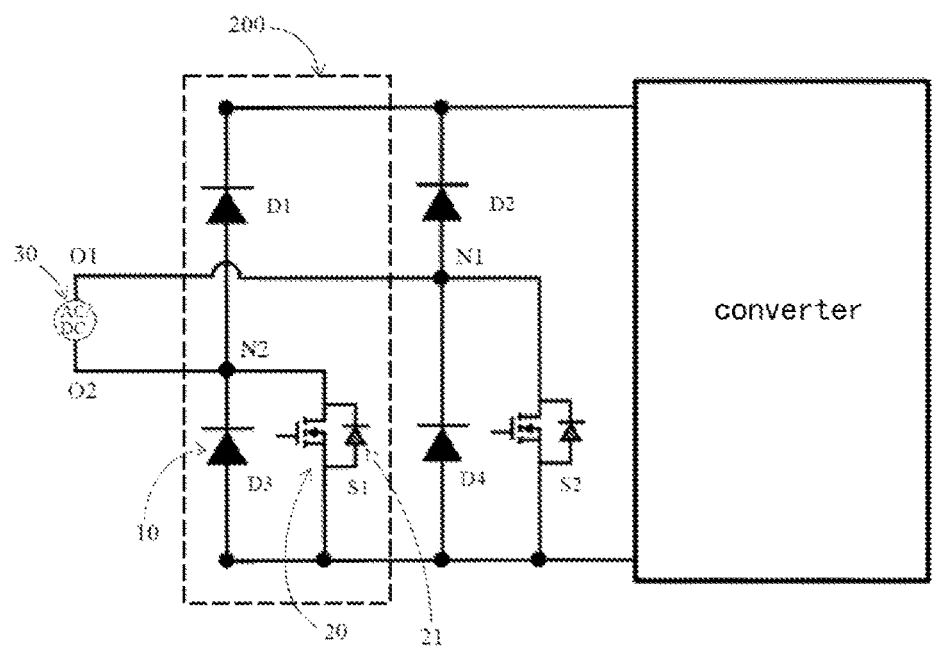
FIG. 5 is a circuit structural diagram of a composite switching circuit applied to the bridge rectifier circuit according to another preferable embodiment of the present disclosure.

As shown in FIGS. 2, 3 and 5, a composite switching circuit 200 according to another preferable embodiment of the present disclosure may include even first semiconductor devices 10 (such as, four diodes D1 to D4) and a plurality of second semiconductor devices 20 (such as, two diodes S1 and S2). Every two of the first semiconductor devices 10 are connected in series to form a bridge arm. As shown in FIG. 5, the diodes D1 and D3 are connected in series to form a first bridge arm, and the diodes D2 and D4 are connected in series to form a second bridge arm. Each of the second semiconductor devices 20 is connected in parallel to one of the first semiconductor devices 10. For example, the switch S1 is connected in parallel to the diode D3 in the first bridge arm, and the switch S2 is connected in parallel to the diode D4 in the second bridge arm. Moreover, the composite switching circuit 200 is connected to an input source 30. For example, a first end O1 of the input source 30 is connected to a node N1 connecting the diodes D2 and D4, and a second end O2 of the input source 30 is connected to a node N2 connecting the diodes D1 and D3. A part of the second semiconductor devices 20 may be turned off during a preset period to transfer the current flowing through the second semiconductor devices 20 to the first semiconductor devices 10 connected in parallel to the second semiconductor devices 20 in turned-off state. For example, the DC current through the switches S1 and S2 may be transferred to the corresponding diodes D3 and D4.

Preferably, the embodiment shown in FIG. 5 may be applied to some cases in which the cost is required to be reduced, i.e., only the two switches S1 and S2 at a low voltage side are remained, and only the diodes D1 and D2 are configured for rectification at a high voltage side. In such case, when the input source 30 supplies a DC current, only one of the switches S1 and S2 is turned on, and the problem of the heat concentration is serious. A part of the heat on the switches S1 and S2 can be transferred to the diodes D3 and D4 connected in parallel to the switches S1 and S2 by controlling the turn-off time of the switches S1 and S2.

Figure 6:
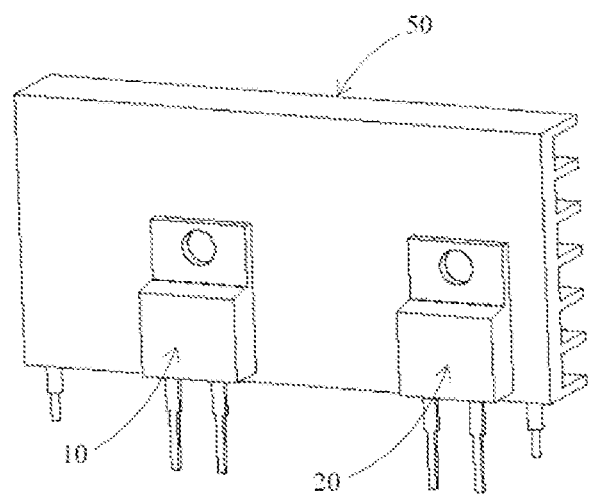
FIG. 6 is a structural diagram showing a first semiconductor device and a second semiconductor device of the composite switching circuit are thermally coupled to different positions of a same heat dissipation substrate according to a preferable embodiment of the present disclosure.
Figure 7:
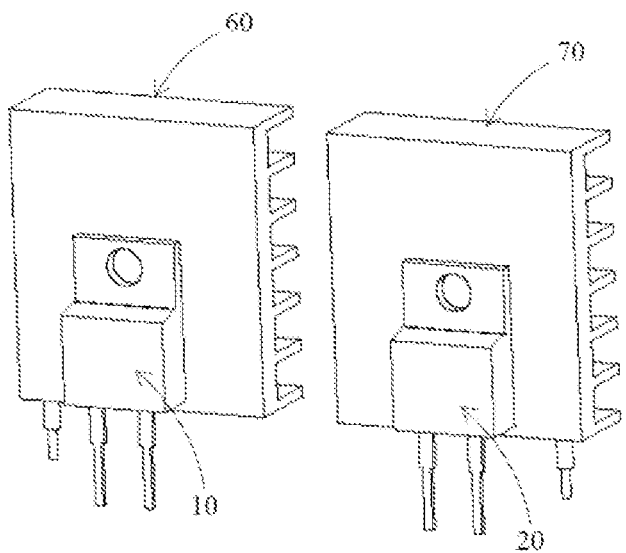
FIG. 7 is a structural diagram showing a first semiconductor device and a second semiconductor device of the composite switching circuit are thermally coupled to different heat dissipation substrates according to another preferable embodiment of the present disclosure.

In the present disclosure, in order to further improve the heat dissipation effect, and reduce the heat concentration, preferably, as shown in FIG. 6, at least one of the first semiconductor devices 10 and at least one of the second semiconductor devices 20 may be thermally coupled to different positions of a same heat dissipation substrate 50. Alternatively, as shown in FIG. 7, at least one of the first semiconductor devices 10 and at least one of the second semiconductor devices 20 may be thermally coupled to different heat dissipation substrates 60 and 70, respectively. The heat dissipation substrates 50, 60 and 70 may be radiators or thermally conductive pads.

In the present disclosure, when the DC is inputted, the loss may be transferred to a first semiconductor device (such as, a diode) by turning off a second semiconductor device (such as, a rectifier switch), thereby effectively solve the problem of the concentration of the heat of the rectifier circuit and the temperature of the switch over specification in the prior art. By using the composite switching circuit of the present disclosure, the thermal performance of the power supply may be effectively improved, and on the other hand, the switching circuit of the power supply may include a power switch having a larger on-resistance, thereby reducing the cost.

Exemplary embodiments of the present disclosure have been shown and described above. It should be understood that the present disclosure is not limited to the disclosed embodiments. Instead, the present disclosure intends to cover various modifications and equivalents included in the spirit and scope of the appended claims.

What is claimed is:

1. A composite switching circuit, comprising:
a plurality of first semiconductor devices connected in series; and
at least one second semiconductor device, each connected in parallel to one of the plurality of first semiconductor devices,
wherein the composite switching circuit is electrically coupled to an input source,
wherein, when the input source supplies a DC current or an AC current which is not symmetrical in positive and negative half cycles to the composite switching circuit, the second semiconductor device is turned off during a preset period to transfer a current flowing through the second semiconductor device to the first semiconductor device connected in parallel to the second semiconductor device, and
wherein the second semiconductor device is a power semiconductor switching device having a body diode, and a turn-on voltage drop of the body diode is larger than that of the first semiconductor device connected in parallel to the second semiconductor device.

2. The composite switching circuit of claim 1, wherein the composite switching circuit is applied to a bridge rectifier circuit.

3. The composite switching circuit of claim 1, wherein the second semiconductor device is selected from a MOSFET, a GaN FET and a SiC MOSFET.

4. The composite switching circuit of claim 1, wherein at least one of the first semiconductor devices and the at least one second semiconductor device are thermally coupled to different heat dissipation substrates, or thermally coupled to different positions of a same heat dissipation substrate.

5. The composite switching circuit of claim 4, wherein the heat dissipation substrate is a radiator.

6. The composite switching circuit of claim 4, wherein the heat dissipation substrate is a thermally conductive pad.

7. A composite switching circuit, comprising:
even first semiconductor devices, every two of the first semiconductor devices are connected in series to form a bridge arm; and
a plurality of second semiconductor devices, each connected in parallel to one of the first semiconductor devices,
wherein a plurality of bridge arms are connected in parallel and electrically coupled to an input source,
wherein, when the input source supplies a DC current or an AC current which is not symmetrical in positive and negative half cycles to the composite switching circuit, at least part of the second semiconductor devices are turned off during a preset period to transfer a current flowing through the second semiconductor devices to the first semiconductor devices connected in parallel to the second semiconductor devices in turned-off state, and
wherein the second semiconductor devices are power semiconductor switching devices having body diodes, and a turn-on voltage drop of any one of the body diodes is larger than that of the first semiconductor device connected in parallel to a corresponding one of the second semiconductor devices.

8. The composite switching circuit of claim 7, wherein the composite switching circuit is applied to a bridge rectifier circuit.

9. The composite switching circuit of claim 7, wherein the second semiconductor devices are selected from a MOSFET, a GaN FET and a SiC MOSFET.

10. The composite switching circuit of claim 7, wherein at least one of the first semiconductor devices and at least one of the second semiconductor devices are thermally coupled to different heat dissipation substrates, or thermally coupled to different positions of a same heat dissipation substrate.

11. The composite switching circuit of claim 10, wherein the heat dissipation substrate is a radiator.

12. The composite switching circuit of claim 10, wherein the heat dissipation substrate is a thermally conductive pad.

* * * * *